United States Patent [19]

Rouws

[11] Patent Number: 4,524,933
[45] Date of Patent: Jun. 25, 1985

[54] APPARATUS AND MOUNTING SHELL HAVING RETAINING TONGUES FORMED BY CUTS

[75] Inventor: Petrus L. A. Rouws, Eindhoven, Netherlands

[73] Assignee: U.S. Philips Corporation, New York, N.Y.

[21] Appl. No.: 644,667

[22] Filed: Aug. 27, 1984

Related U.S. Application Data

[63] Continuation of Ser. No. 399,043, Jul. 16, 1982, abandoned.

[30] Foreign Application Priority Data

Jul. 29, 1981 [NL] Netherlands .................. 8103575

[51] Int. Cl.³ .............................................. G12B 9/00
[52] U.S. Cl. .................................... 248/27.3; 339/131
[58] Field of Search ............... 248/27.1, 27.3, DIG. 6; 200/296, 295; 220/3.5, 3.6; 339/131

[56] References Cited

U.S. PATENT DOCUMENTS

| | | | |
|---|---|---|---|
| 1,246,107 | 11/1917 | Kendig | 220/3.5 |
| 2,143,517 | 1/1939 | Huff | 220/3.5 |
| 2,616,643 | 11/1952 | Budd | 339/131 UX |
| 2,930,505 | 3/1960 | Meyer | 248/27.1 X |
| 2,969,418 | 1/1961 | Benander | 339/131 X |
| 3,023,920 | 3/1962 | Cook et al. | 220/3.6 |
| 3,308,260 | 3/1967 | Krieger et al. | 200/295 |
| 3,799,483 | 3/1974 | Chiappinelli | 248/27.3 |

FOREIGN PATENT DOCUMENTS 2903176  7/1980  Fed. Rep. of Germany.

Primary Examiner—J. Franklin Foss
Attorney, Agent, or Firm—David R. Treacy

[57] ABSTRACT

An apparatus is mounted in a hole in a mounting wall by a shell having tongues which are bent outward from the shell to engage an inner surface of the mounting wall. Each tongue is bent about an axis perpendicular to the mounting wall, and has a supporting portion perpendicular to the mounting wall and a mounting portion extending from the supporting portion and having a free end bearing against the inner mounting wall surface. Pivoting of the tongue about the first axis causes the mounting portion to bend with respect to the supporting portion, bearing against the mounting wall with a force related to the degree of deformation.

16 Claims, 5 Drawing Figures

APPARATUS AND MOUNTING SHELL HAVING RETAINING TONGUES FORMED BY CUTS

This is a continuation, of application Ser. No. 399,043, filed July 16, 1982 now abandoned.

BACKGROUND OF THE INVENTION

The invention relates to an apparatus which is secured in a rectangular parallelepipedal metal mounting shell, the mounting shell being inserted into an opening in a mounting wall and secured to the mounting wall by means of bent tongues. At least one tongue is formed in each of four walls of the shell. The tongues lie in planes perpendicular to the plane of the mounting wall, and are each formed by a cut which leaves a bridge portion between the relevant tongue and the shell. The mounting shell includes an abutment which bears against at least a portion of the outer surface of the mounting wall surrounding the opening with a given force which is produced by the bending of the tongues. The apparatus is then held by fastening means on the apparatus and on the shell which engage one another when the apparatus is inserted into the shell.

In an apparatus of this kind described in German patent application No. 2,903,176, the bridge portion which connects the tongue to the remainder of the mounting shell is situated near the abutment which is then formed by a flange or upright edge. The distance between the bridge portion and the flange or upright edge is dependent on the thickness of the mounting wall. This means that even though excellent results are obtained in the case of comparatively thick mounting walls, deformation of the portion of the mounting shell which is situated between the bridge portion and the extreme edge of the mounting shell can occur in the case of comparatively thin mounting walls.

SUMMARY OF THE INVENTION

It is an object of the invention to provide an apparatus and a mounting shell for such an apparatus in which the distance between the bridge portion and the abutment can be so large that, even in the case of comparatively small wall thicknesses of the mounting wall or comparatively large forces on the bridge portion and/or the tongue, there will be no unacceptable deformation of the portion of the mounting shell which is situated between the bridge portion and the extreme edge of the mounting shell.

To this end, an apparatus in accordance with the invention is characterized in that each of the tongues comprises a mounting portion, and a supporting portion which supports the mounting portion, which have been pivoted together at the location of the bridged portion in a direction which curves in a first plane which is parallel to the plane of the mounting wall, about a first axis which extends along the bridge portion and perpendicularly to the plane of the mounting wall. The mounting portion is also bent relative to the supporting portion in a direction which curves in a second plane which is perpendicular to the plane of the mounting wall, about a second axis which is situated in a plane parallel to the plane of the mounting wall, the free end of the mounting portion bearing against the inner surface of the mounting wall with a force which is determined mainly by the degree of deformation of the mounting portion.

Because the second axis can be situated at a substantial distance from the extreme edge of the mounting shell during mounting as well as during operation, hardly any deformation occurs of the portion of the mounting shell which is situated between the bridge portion and the extreme edge.

In a mounting shell in accordance with the invention, in each of the four walls of the shell a pivotable tongue is formed by a cut in the wall. The tongue comprises a mounting portion and a supporting portion, the mounting portion and its supporting portion being pivotable together at the location of the bridge portion in a direction which curves in a first plane which is perpendicular to the planes of said four walls of the shell, about a first axis which is parallel to the planes of said four walls of the shell. The mounting portion is also bendable relative to its supporting portion about a second axis which is perpendicular to the first axis.

A mounting shell embodiment in accordance with the invention which is suitable for mounting in mounting walls having at least two different nominal thicknesses is characterized in that a pair of pivotable tongues is provided in each of four walls of the shell, the two tongues of each pair having free ends which face one another and being situated in a zone which is bounded by the respective two first axes. The mounting portions of the two tongues have different dimensions, each of which is adapted to the thickness of a given mounting wall.

A further special embodiment of a mounting shell in accordance with the invention is characterized in that the location of the first axis, which extends along the bridge portion, is determined by one or more weakened portions in the bridge portion. Due to the weakened portions in the bridge portion, the supporting portion extends almost at right angles to the wall of the mounting shell, so that the force exerted on the mounting portion by the mounting wall acts at a comparatively small distance from the first axis. This allows the mounting of heavy apparatus which are subject to high ejection forces. Ejection forces are to be understood herein to mean forces which act on the apparatus or the mounting portions of the tongues during acceleration or deceleration of the mounting wall. Such ejection forces can occur in the case of shocks or jolts and during deceleration and acceleration of vehicles or vessels in which the apparatus is mounted.

The invention will be described in detail hereinafter with reference to the drawings.

DESCRIPTION OF THE PREFERRED EMBODIMENTS

Figure 1:
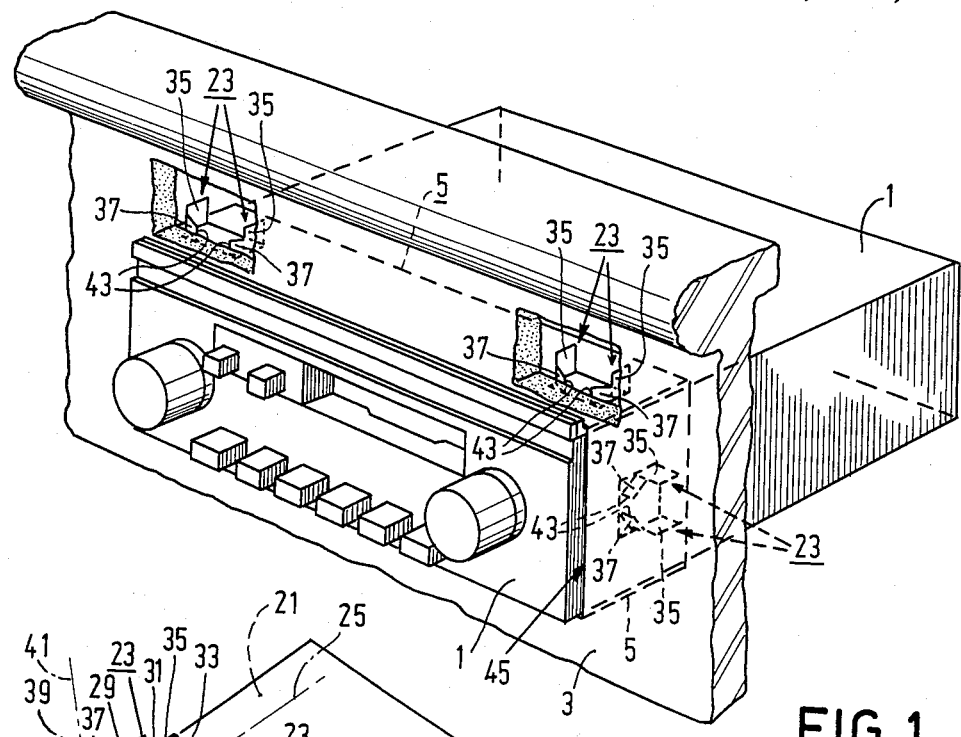
FIG. 1 is a perspective view of an apparatus in accordance with the invention in the mounted condition.
Figure 2:
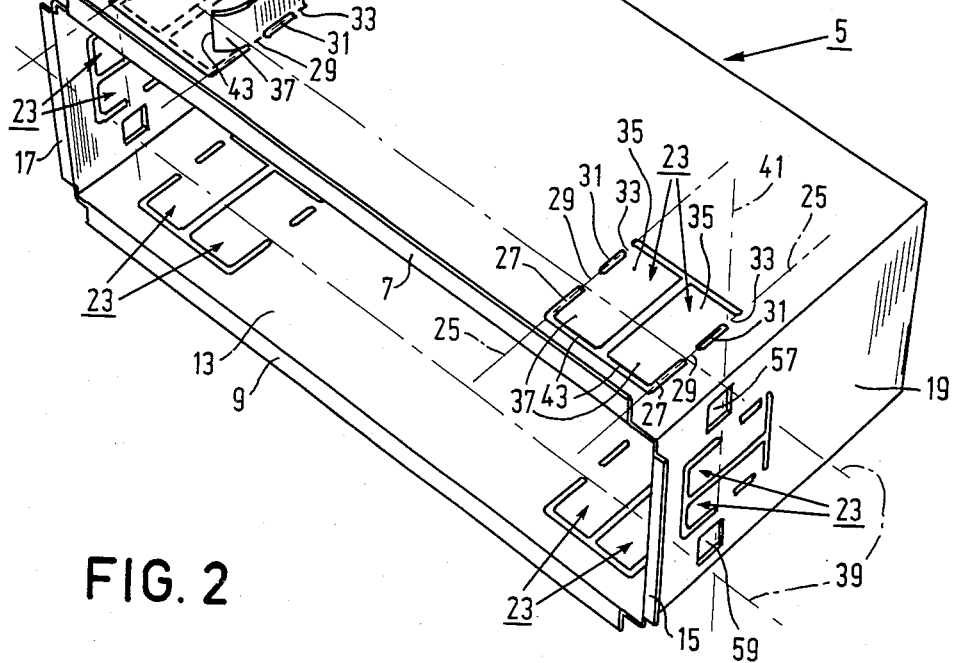
FIG. 2 is a perspective view of the mounting shell shown partially, with one tongue in the erect, mounted position in FIG. 1.
Figure 3:
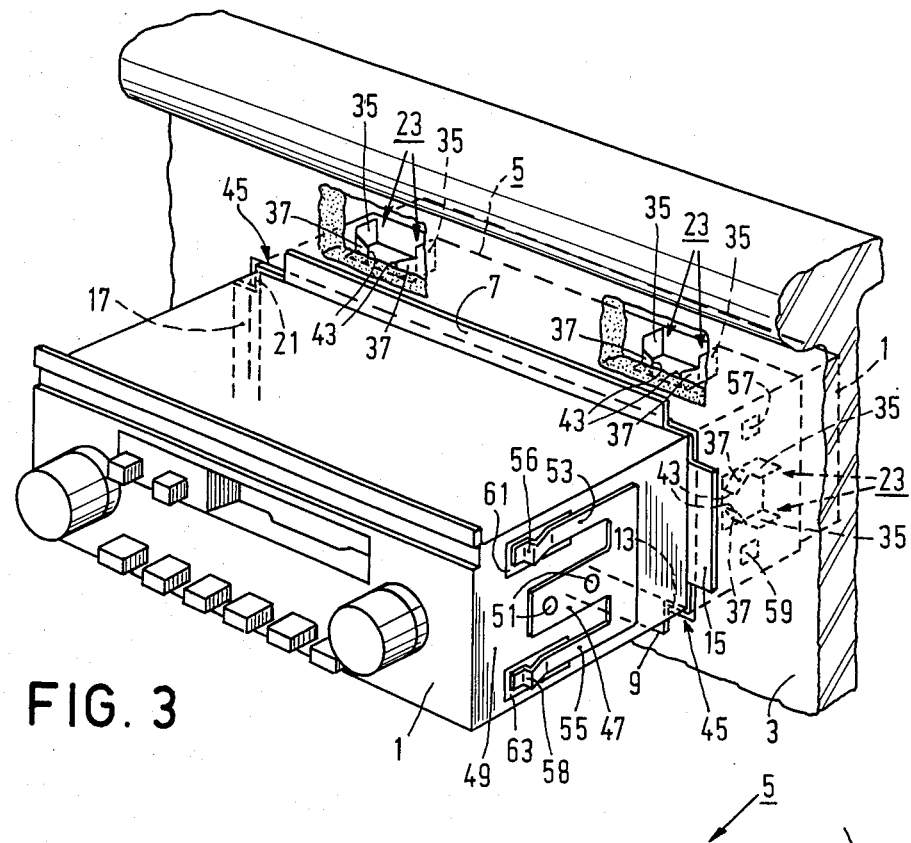
FIG. 3 is a perspective view of an apparatus in accordance with the invention before mounting.

The apparatus 1 which is shown in FIGS. 1 and 3 comprises a radio 1 having a customary rectangular box shape. FIG. 1 shows the radio 1 mounted in a mounting wall 3. The mounting wall 3 forms, for example, part of the dashboard of a car, the apparatus being a car radio with cassette player. The radio 1 is mounted in the mounting wall 3 by means of a rectangular parallelepipedal metal mounting shell 5 which is shown in the pre-mounting condition in FIG. 2. Before the mounting of the radio 1 in the mounting shell 5, the latter must itself be mounted in the mounting wall 3. This situation is illustrated in FIG. 3.

The rectangular parallelepipedal metal mounting shell 5, which is shown in FIG. 2, preferably has a wall thickness of 0.5 mm and at its front comprises an abutment which is formed by upright edges or flanges 7 and 9 on the upper and lower walls 11 and 13, respectively, of the mounting shell and by upright edges or flanges 15 and 17 on the right-hand and left-hand side walls 19 and 21, respectively, of the mounting shell. The upper wall 11 and the lower wall 13 each have two pairs of rectangular tongues 23 which are formed in pairs by cuts in the walls 11 and 12. Each of the side walls 19 and 21 also have a pair of tongues 23 formed by cuts in these walls. The free ends of the tongues 23 of each pair face one another.

All tongues 23 are identical. Each tongue 23 is pivotable and/or bendable about a fist axis 25 which extends parallel to the upper and lower walls and the side walls of the mounting shell 5. For the sake of simplicity, FIG. 2 shows only the first axes 25 for the tongues 23 formed in the upper wall 11. Each of the first axes 25 extends along a cut 27, a bridge portion 29, a weakened (slotted) portion 31 and a bridge portion 33. Each tongue 23 comprises a supporting portion 35 and a supporting portion 37 which are pivotable together about the relevant first axis 25. The mounting portion 37 of each of the tongues in the upper wall 11 and the lower wall 13 is bendable relative to its associated supporting portion 35 about a second axis 39 which forms a boundary between the supporting and mounting portions. The second axes 39 are situated in a plane which extends perpendicularly to the planes of the upper and lower walls and the side walls of the mounting shell. The mounting portion 37 of each of the tongues in the side walls 19 and 21 is similarly bendable relative to its associated supporting portion 35 about a second axis denoted by the reference numeral 41. The second axes 41 are also situated in a plane which extends perpendicularly to the planes of the upper and lower walls and the side walls of the mounting shell. The axes 39 and 41 extend substantially perpendicularly to one another in the mounted as well as in the non-mounted condition of the mounting shell.

Figure 4:
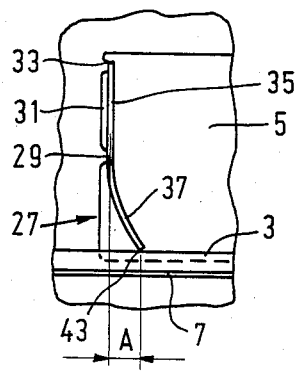
FIG. 4 is an enlarged view of a tongue of a mounting shell as shown in FIG. 2 in the mounted condition.

The combination formed by each cut 27 and the associated bridge portions 29 and 33 and weakened portion 31 enables the respective tongue 23 to be pivoted about the respective axis 25 into an erect position perpendicular to the respective wall 11, 13, 19 or 21 by comparatively small forces without comparatively strong bending, so that it acts as if it were a hinge for the tongue 23. In the bridge portions 29 and 33 plastic deformation occurs. An axis 25 can be formed without the provision of the weakened portion 31 by giving a certain length to the cut 27. The bending of the tongue 23 will then be stronger, and the bending force also will be somewhat greater. For the sake of clarity, the left-hand pair of tongues 23 in the upper wall 11 is shown erected in FIG. 2 as if the mounting shell had already been mounted in a mounting wall. For the bending of the mounting portions 37 of the tongues 23 actually to take place during the pivoting of the tongues 23 about the axes 25, the distance between the face ends 43 of the mounting portions 37 and the flange 7 (see the right-hand pair of tongues in the upper wall 11 in FIG. 2) obviously needs to be smaller than the wall thickness of the mounting wall 3. Only then is a situation obtained in which, when the mounting shell is mounted in the mounting wall, during the pivoting of a tongue 23 about the axis 25 the mounting portion 37 of the tongue will bear against the inner side of the mounting wall and thereby be forced to bend. The mounting portion 37 reaches the extreme position shown in FIG. 4 when the mounting portion 35 is substantially perpendicular to the plane of the upper wall 11 and also substantially parallel to the side wall 19. During mounting, the mounting shell 5 is inserted into an opening 45 (see the FIGS. 1 and 3) in the mounting wall 3. This opening is situated in a flat portion of the mounting wall 3. FIGS. 1, 3 and 4 show how the ends 43 of the mounting portions are then brought to bear against the inner side of the mounting wall 3. It can be seen that the pivoting or bending of the supporting portion 35 takes place in the direction which curves in a first plane which is parallel to the plane of the mounting wall 3 at the area of mounting, while the bending of the mounting portion 37 takes place in a direction which curves in a second plane which is perpendicular to the plane of the mounting wall 3 at the area of mounting.

The radio 1 is mounted in the mounting shell 5 in the manner shown in German Patent Application No. 2,903,176, by means of leaf springs 47 (see FIG. 3) which are connected to the left-hand side wall and the right-hand side wall 49 of the radio 1 by means of riveted and/or screwed connections 51 (only the leaf spring 47 on the right-hand side wall 49 is shown). The leaf spring 47 comprises two limbs 53 and 55 which are formed with shoulders 56 and 58 which engage the edges of openings 57 and 59 in the relevant side wall 19 of the mounting shell 5. If desired, the radio 1 can be removed from the mounting shell 5 by means of a special tool (not shown). During insertion of the radio in or its removal from the mounting shell the limbs 53 and 55 are deflected into openings 61 and 63 in the side wall 49 of the radio 1.

The radio 1 is held in a very stable manner by the mounting shell 5 because a total of twelve mounting tongue portions 37 which are symmetrically distributed over the circumference of the mounting shell press against the inner side of the mounting wall 3 (see FIG. 3). The distance A between the end 43 of the mounting portion of an erected tongue and the plane of its supporting portion 36 (see FIG. 4) is preferably as small as possible, because the smaller the deflection of the mounting portion 37 during the erection of the tongue, the greater will be the resistance to further bending and ultimately folding-over of the mounting portion 37. This can be achieved by situating the transition zone between mounting portion 37 and its and supporting portion 35 at the area where an optimum length for the mounting portion 37 is obtained. Such optimizing of the length of the mounting portion is determined by the number of mounting walls of different wall thicknesses for which the mounting shell 5 is to be made suitable.

Figure 5:
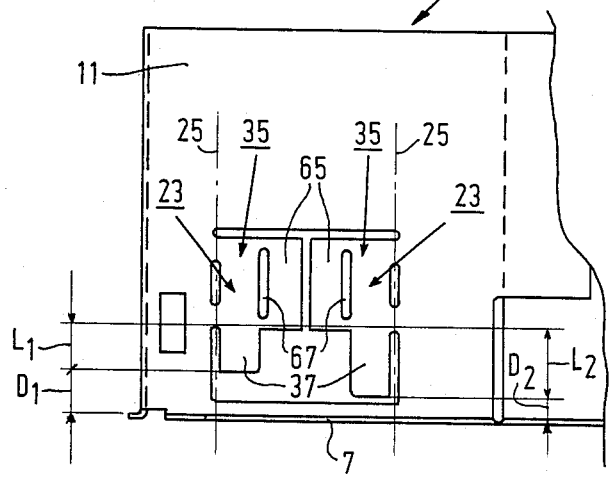
FIG. 5 is an enlarged view of a part of a preferred mounting shell embodiment in accordance with the invention for use with mounting walls of different thicknesses.

The preferred embodiment of a mounting shell 5 shown in FIG. 5 has been designed for two different wall thicknesses, while the mounting shell 5 described above and shown in FIG. 2 has been designed for one wall thickness. A somewhat larger number of wall thicknesses around the design value (nominal value) can be covered by some variation of the dimension A (FIG. 4). In the embodiment shown in FIG. 5, two ranges of wall thicknesses around the two design values are thus obtained. This is achieved by providing the two tongues 23 of each pair of tongues with mounting portions 37 having a length $L_1$ and $L_2$, respectively. The mounting shell 5 is thus suitable for wall thicknesses having a nominal value $D_1$ and $D_2$ by utilizing only the mounting portions of the same length. By allowing a variation of the dimension A (FIG. 4), wall thicknesses around the nominal values $D_1$ and $D_2$ are also acceptable. The supporting portions 35 of each tongue comprise an additional portion 65 in which there is provided a slot 67 in which a screw driver can be inserted in order to pivot the tongue 23 about the associated axis 25.

In the exceptional case where the acceleration or deceleration of the mounting wall 3 is so high that the supporting portion 37 of the tongues 23 are deflected beyond the position shown in FIG. 4, an installed apparatus 1 still cannot enter the interior of the vehicle or vessel. Even when the mounting portions 37 are excessively deflected so as to extend perpendicularly to their supporting portions 35, such a risk of ejection of the apparatus is avoided by the tongues 23. Moreover, the operator is warned by the apparatus 1 starting to rattle in the mounting wall 3 together with the mounting shell 5.

Although the invention has been described with reference to mounting walls in vehicles or vessels, it is not restricted thereto. The invention can also be effectively used for mounting walls which are usually stationary, notably in the case of jolts, shocks or vibrations.

What is claimed is:

1. An arrangement for securing an element inserted into a hole in a mounting wall, said mounting wall having outer and inner surfaces spaced a given wall thickness apart, and said element having at least one element wall arranged to extend perpendicularly through said mounting wall adjoining an edge of the hole in the mounting wall; an abutment portion arranged to bear against a portion of said outer surface; and at least one tongue formed by a cut in said element wall arranged to leave a bridge portion between the tongue and the element wall, and bent outward from said element wall and arranged to engage said inner wall and press against said inner wall with force resulting from bending of a portion of the tongue, characterized in that said tongue comprises a mounting portion and a supporting portion which are bent outward together from said element wall about a first axis perpendicular to said mounting wall and extending along said bridge portion; and said mounting portion has a free end which engages and bears against said inner surface, and is arranged such that said mounting portion is bent relative to the supporting portion about a second axis parallel to said supporting portion and lying in a plane parallel to said mounting wall, whereby said free end bears against said inner surface with a force determined mainly by the degree of deformation of the mounting portion.

2. An arrangement as claimed in claim 1, characterized in that said element wall has a pair of said tongues formed therein by a cut, the tongues being disposed in a zone bounded by the respective bridge portions and having mounting portions adapted to different thicknesses of mounting walls.

3. An arrangement as claimed in claim 2, characterized in that said bridge portions and supporting portions of said pair of tongues are symmetrical about a cut between the tongues, the bridging portions of the tongues extending parallel to each other and perpendicular to the mounting wall, the mounting portions having different lengths in a direction parallel to said bridging portions.

4. An arrangement as claimed in claim 3, characterized in that each first axis is defined by a weakened portion formed in the respective bridging portion.

5. An arrangement as claimed in claim 1, characterized in that said first axis is defined by a weakened portion formed in the bridging portion.

6. An arrangement as claimed in claim 5, characterized in that said weakened portion is a cut.

7. An arrangement as claimed in claim 1, characterized in that said element is secured solely by a plurality of said tongues spaced about the perimeter of the hole, and at least a respective abutment portion disposed opposite each tongue.

8. An arrangement as claimed in claim 7, characterized in that said element is a mounting shell for an apparatus, and said shell further comprises fastening means for securing an apparatus inserted into the shell.

9. An arrangement as claimed in claim 8, characterized in that said hole is a rectangular hole having a width greater than height, said shell is a parallelepipedal metal shell having an upper and lower wall and two side walls, at least two tongues spaced apart in said upper wall and at least two tongues spaced apart in said lower wall, and said fastening means includes at least one opening formed in each of said side walls.

10. An apparatus secured in a metal mounting shell inserted into a hole in a mounting wall, said mounting wall having outer and inner surfaces spaced a given distance apart, and said shell having at least one shell wall arranged to extend perpendicularly through said mounting wall adjoining an edge of the hole in the mounting wall; an abutment arranged to bear against at least a plurality of portions of said outer surface spaced about said hole; and a respective plurality of tongues formed by cuts in said shell wall arranged to leave a respective bridge portion between the respective tongue and the shell wall, said tongues being bent outward from said shell wall at locations opposed to said portions of said outer surface, and being arranged to engage said inner wall and press against said inner wall with force resulting from bending of a portion of each respective tongue, characterized in that each tongue comprises a mounting portion and a supporting portion which are bent outward together from said shell wall about a respective first axis perpendicular to said mounting wall and extending along the respective bridge portion; and each said mounting portion has a respective free end which engages said inner surface and is arranged such that the respective mounting portion is bent relative to the respective supporting portion about a respective second axis parallel to the respective supporting portion and lying in a plane parallel to said mounting wall, whereby each free end bears against said inner surface with a force determined mainly by the degree of deformation of the respective mounting portion.

11. An apparatus as claimed in claim 10, characterized by comprising a plurality of pairs of said tongues, the bridging portions and supporting portions of each pair of tongues being arranged symmetrically about a cut between the respective tongues of the pair.

12. An arrangement as claimed in claim 11, characterized in that said hole is a rectangular hole having a width greater than height, said shell is a parallelepipedal metal shell having an upper and a lower wall and two side walls, and at least two pairs of tongues spaced apart in said upper wall and at least two pairs of tongues spaced apart in said lower wall, and said fastening means includes at least one opening formed in each of said side walls.

13. An apparatus secured in a rectangular, parallelepipedal metal mounting shell by fastening means on the apparatus and on the shell which engage one another when the apparatus is inserted into the shell, said mounting shell being inserted into an opening in a mounting wall and being secured to the mounting wall by means of tongues bent from said shell, at least one of said tongues being formed in each of four walls of the shell which lie in planes perpendicular to the mounting wall, each of said tongues being formed by a cut which leaves a bridge portion between the respective tongue and the shell, the mounting shell further comprising an abutment which bears against at least a portion of the mounting wall surrounding the opening with a force which is produced by the bending of said tongues, characterized in that each of the tongues comprises a mounting portion and a respective supporting portion which have been pivoted together in a direction which curves in a first plane parallel to the mounting wall, about a respective first axis extending along the respective bridge portion perpendicularly to the mounting wall, and each supporting portion is also bent relative to the respective mounting portion in a direction which curves in a respective second plane perpendicular to the plane of the mounting wall, about a respective second axis situated in a plane parallel to the plane of the mounting wall, whereby the free end of each mounting portion bears against the mounting wall with a force determined mainly by the degree of deformation of the respective mounting portion.

14. A mounting shell for an apparatus as claimed in claim 13, characterized in that a pivotable tongue is formed in each of said four walls of the shell by a cut in the respective shell wall, each said tongue comprising a respective mounting portion and supporting portion which are pivotable together in a direction which curves in a respective first plane perpendicular to the planes of said four shell walls, about a respective first axis parallel to the planes of said four walls, each of said mounting portions also being bendable relative to the respective supporting portion about a respective second axis perpendicular to the respective first axis.

15. A shell as claimed in claim 14, characterized by comprising a pair of pivotable tongues in each of said four walls, the two tongues of each pair having free ends which face one another and are situated in a zone bounded by the respective two first axes, the mounting portions of the two tongues of a pair having a different dimension adapted to the thicknesses of given mounting walls.

16. A mounting shell for an apparatus as claimed in claim 13, characterized in that each respective first axis which extends along a bridge portion is formed by one or more weakened portions in the respective bridge portion.

* * * * *